(12) United States Patent
Ito et al.

(10) Patent No.: US 10,673,382 B2
(45) Date of Patent: *Jun. 2, 2020

(54) OSCILLATOR, ELECTRONIC APPARATUS, VEHICLE, AND METHOD OF MANUFACTURING OSCILLATOR

(71) Applicant: Seiko Epson Corporation, Tokyo (JP)

(72) Inventors: Hisahiro Ito, Minowa (JP); Nobutaka Shiozaki, Shiojiri (JP); Seiichiro Tamura, Ina (JP)

(73) Assignee: Seiko Epson Corporation (JP)

( * ) Notice: Subject to any disclaimer, the term of this patent is extended or adjusted under 35 U.S.C. 154(b) by 58 days.

This patent is subject to a terminal disclaimer.

(21) Appl. No.: 15/593,802

(22) Filed: May 12, 2017

(65) Prior Publication Data

US 2017/0346442 A1 Nov. 30, 2017

(30) Foreign Application Priority Data

May 31, 2016 (JP) ................................. 2016-108269

(51) Int. Cl.
| | |
|---|---|
| *H03B 5/36* | (2006.01) |
| *H03B 1/02* | (2006.01) |
| *H01L 41/04* | (2006.01) |
| *H03B 5/32* | (2006.01) |

(52) U.S. Cl.
CPC ............ *H03B 1/02* (2013.01); *H01L 41/042* (2013.01); *H03B 5/326* (2013.01); *H03B 5/364* (2013.01); *H03B 5/366* (2013.01)

(58) Field of Classification Search
CPC ........... H01L 41/042; H03B 5/30; H03B 5/32; H03B 5/36; H03B 5/362; H03B 5/364; H03B 5/366

USPC .......................................... 331/154, 158, 160
See application file for complete search history.

(56) References Cited

U.S. PATENT DOCUMENTS

| | | | | |
|---|---|---|---|---|
| 4,956,618 | A * | 9/1990 | Ulmer ................... | H03B 5/364 |
| | | | | 331/108 A |
| 5,923,222 | A * | 7/1999 | Russell ................. | H03F 3/3001 |
| | | | | 331/116 FE |
| 6,118,348 | A * | 9/2000 | Narahara ............. | H03K 3/0307 |
| | | | | 331/116 FE |
| 7,030,709 | B2 * | 4/2006 | Novac ..................... | H03B 5/06 |
| | | | | 331/116 FE |
| 7,109,810 | B2 | 9/2006 | Senthilkumar et al. | |
| 2004/0090279 | A1 * | 5/2004 | Seki ...................... | H03K 3/0307 |
| | | | | 331/158 |
| 2009/0121799 | A1 | 5/2009 | Ishikawa | |
| 2009/0261914 | A1 * | 10/2009 | Kao ....................... | H03B 5/06 |
| | | | | 331/158 |

(Continued)

FOREIGN PATENT DOCUMENTS

| | | |
|---|---|---|
| JP | 2004-085324 A | 3/2004 |
| JP | 2010-011254 A | 1/2010 |

(Continued)

*Primary Examiner* — Levi Gannon
(74) *Attorney, Agent, or Firm* — Harness, Dickey & Pierce, P.L.C.

(57) ABSTRACT

An oscillator includes an external terminal, a resonator, and an oscillation circuit that oscillates the resonator. The oscillation circuit includes an amplification circuit and a current source that supplies a current to the amplification circuit, and the current is variably set according to a control signal input from the external terminal.

14 Claims, 10 Drawing Sheets

(56) References Cited

U.S. PATENT DOCUMENTS

| | | | |
|---|---|---|---|
| 2010/0188156 A1* | 7/2010 | Arai | H03B 5/366 |
| | | | 331/15 |
| 2014/0210565 A1* | 7/2014 | Vilas Boas | H03L 5/00 |
| | | | 331/158 |
| 2015/0056934 A1 | 2/2015 | Griffith et al. | |
| 2015/0116043 A1 | 4/2015 | Itasaka et al. | |
| 2015/0116048 A1 | 4/2015 | Yamamoto et al. | |
| 2016/0181978 A1* | 6/2016 | Mittal | H03B 5/364 |
| | | | 331/116 FE |
| 2017/0288680 A1* | 10/2017 | Feng | H03B 5/32 |
| 2018/0109264 A1* | 4/2018 | Kim | H03B 5/364 |

FOREIGN PATENT DOCUMENTS

| | | |
|---|---|---|
| JP | 2010-246059 A | 10/2010 |
| JP | 2015-088924 A | 5/2015 |

\* cited by examiner

OSCILLATOR, ELECTRONIC APPARATUS, VEHICLE, AND METHOD OF MANUFACTURING OSCILLATOR

BACKGROUND

1. Technical Field

The present invention relates to an oscillator, an electronic apparatus, a vehicle, and a method of manufacturing an oscillator.

2. Related Art

An oscillator that outputs a signal with a desired frequency by oscillating a resonator such as a quartz crystal resonator, is widely used in various electronic apparatuses and systems. Since this type of oscillator has a oscillation condition in which a negative resistance value of an oscillator circuit for oscillating the resonator is larger than an impedance value of the resonator, before shipment of the oscillator, an inspection for ensuring that the negative resistance value of the oscillator circuit is sufficiently larger than the impedance value of the resonator, is performed. For example, JP-A-2004-85324 discloses a negative resistance measurement apparatus capable of simply measuring a negative resistance value of the oscillator circuit (negative resistance circuit) of the oscillator at a low cost in a form according to an actual oscillation condition.

However, in a case where an inspection method in the related art, which uses the negative resistance measurement apparatus as described in JP-A-2004-85324, is applied, it is necessary to provide inspection terminals electrically connected to both ends of the resonator in the oscillator. Thus, in the oscillator with a small package, it is difficult to secure a space for disposing the inspection terminals, and it is also difficult to probe the oscillator using the inspection terminals of the measurement apparatus. Since the terminals for probing are exposed to the outside of the oscillator, a risk of breakdown of the oscillation circuit due to input of static electricity via the terminals may also increase.

SUMMARY

An advantage of some aspects of the invention is to provide an oscillator and a method of manufacturing an oscillator, which are capable of reducing the size of the oscillator, reducing a risk of breakdown due to static electricity, and inspecting an impedance value of the resonator. Further, an advantage of some aspects of the invention is to provide an electronic apparatus using the oscillator and a vehicle using the oscillator.

The invention can be implemented as the following embodiments or application examples.

Application Example 1

An oscillator according to this application example includes: an external terminal; a resonator; and an oscillation circuit that oscillates the resonator, in which the oscillation circuit includes an amplification circuit and a current source that supplies a current to the amplification circuit, and in which the current is variably set according to a control signal input from the external terminal.

According to the oscillator of this application example, a negative resistance value of the oscillation circuit is changed according to the current which is variably set by the control signal input from the external terminal. In a case where an impedance value of the resonator is larger than the negative resistance value, oscillation of the resonator is stopped, and thus it is possible to inspect the impedance value of the resonator by observing the output signal of the oscillator.

Further, according to the oscillator of this application example, there is no need to provide inspection terminals electrically connected to both ends of the resonator, and thus it is possible to reduce the size of the oscillator and reduce a risk of breakdown due to static electricity.

Application Example 2

In the oscillator according to the application example, in a case where the current is set to the lower limit of a variable range, the resonator may not oscillate, and in a case where the current is set to the upper limit of a variable range, the resonator may oscillate.

According to the oscillator of this application example, in the variable range of the current, it is possible to search the setting value of the current, which is a boundary between when the resonator oscillates and when the resonator stops oscillation, and it is possible to estimate the impedance value of the resonator based on the setting value of the current which is the boundary.

Application Example 3

In the oscillator according to the application example, as the current becomes large, negative resistance of the oscillation circuit may become large.

According to the oscillator of this application example, as the current flowing through the amplification circuit is set to a larger value, the degree of oscillation margin increases and the oscillation of the resonator is more likely to be stabilized. In contrast, as the current is set to a smaller value, the degree of oscillation margin decreases and the oscillation of the resonator is likely to be stopped. Thus, it is possible to inspect the impedance value of the resonator by changing the setting value of the current.

Application Example 4

In the oscillator according to the application example, the amplification circuit may include an NMOS transistor and a resistor of which the both ends are electrically connected to each of the gate terminal and the drain terminal of the NMOS transistor, and the current source may supply the current to the drain terminal of the NMOS transistor.

According to the oscillator of this application example, the negative resistance value of the oscillation circuit is changed according to the current flowing from the drain terminal of the NMOS transistor to the source terminal of the NMOS transistor. In a case where an impedance value of the resonator is larger than the negative resistance value, oscillation of the resonator is stopped, and thus it is possible to inspect the impedance value of the resonator by observing a signal of the drain terminal of the NMOS transistor.

Application Example 5

In the oscillator according to the application example, the control signal may include at least one pulse, and a setting value of the current may be switched each time the pulse is respectively input to the external terminal.

According to the oscillator of this application example, each time a pulse is input to the external terminal, the setting value of the current supplied to the amplification circuit (negative resistance value of the oscillation circuit) is switched. Thus, it is possible to shorten a time required for inspection, by observing the output signal of the oscillator output from another external terminal each time a pulse is input to the external terminal.

Application Example 6

In the oscillator according to the application example, an external terminal electrically connected to wiring which connects the resonator and the oscillation circuit, may not be included.

According to the oscillator of this application example, there is no need to provide an external terminal (inspection terminal) for inspecting the impedance value of the resonator by probing at the both ends of the resonator. Thus, it is possible to reduce the size of the oscillator and reduce a risk of breakdown of the oscillation circuit due to input of static electricity via the external terminal.

Application Example 7

An electronic apparatus according to this application example includes the oscillator according to any one of the application examples.

Application Example 8

A vehicle according to this application example includes the oscillator according to any one of the application examples.

According to these application examples, it is possible to realize an electronic apparatus and a vehicle with higher reliability, which include the oscillator capable of reducing the size of the oscillator, reducing a risk of breakdown due to static electricity, and inspecting the impedance value of the resonator.

Application Example 9

A method of manufacturing an oscillator according to this application example includes: assembling the oscillator that includes an external terminal, a resonator, and an oscillation circuit which oscillates the resonator, the oscillation circuit being provided with an amplification circuit and a current source which supplies a current to the amplification circuit, and the current being variably set according to a control signal input from the external terminal; and inputting the control signal to the external terminal, and inspecting the oscillator based on a signal output from the oscillator.

According to the method of manufacturing an oscillator of this application example, a negative resistance value of the oscillation circuit is changed according to the current which is variably set by the control signal input from the external terminal of the oscillator. In a case where an impedance value of the resonator is larger than the negative resistance value, oscillation of the resonator is stopped, and thus it is possible to inspect the impedance value of the resonator by observing the output signal of the oscillator.

Further, according to the method of manufacturing an oscillator of this application example, there is no need to provide inspection terminals electrically connected to both ends of the resonator in the oscillator, and thus it is possible to reduce the size of the oscillator and reduce a risk of breakdown due to static electricity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments according to the invention will be described in detail with reference to the drawings. The embodiments described below do not unreasonably limit the contents of the invention described in the appended claims. In addition, all of the configurations described below are not necessarily essential configuration requirements of the invention.

1. Oscillator 1-1. First Embodiment

Configuration of Oscillator

Figure 1:
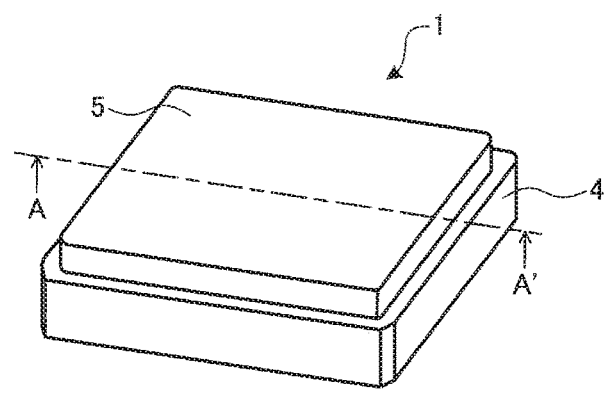
FIG. 1 is a perspective view of an oscillator according to the present embodiment.
Figure 2:
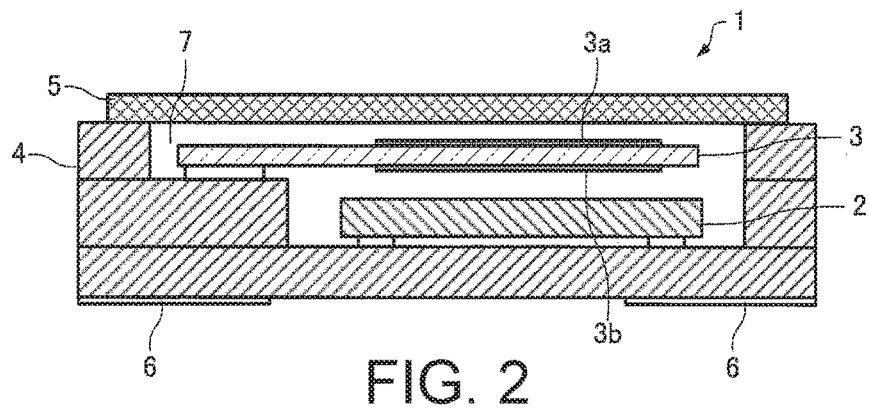
FIG. 2 is a sectional view of the oscillator according to the present embodiment.
Figure 3:
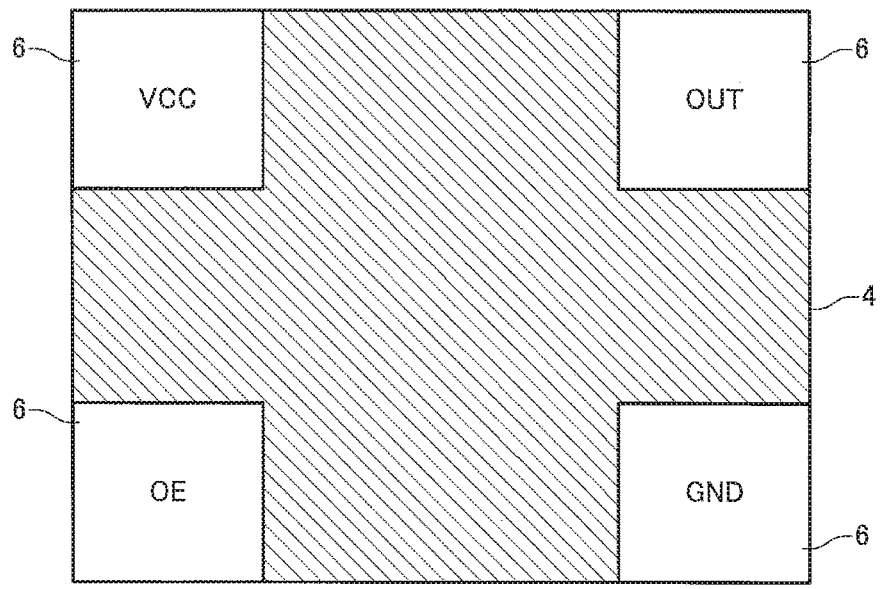
FIG. 3 is a bottom view of the oscillator according to the present embodiment.

FIGS. 1 to 3 are diagrams illustrating an example of a structure of an oscillator 1 according to the present embodiment. FIG. 1 is a perspective view of an oscillator 1, and FIG. 2 is a sectional view taken along line A-A' of FIG. 1. FIG. 3 is a bottom view of the oscillator 1.

As illustrated in FIGS. 1 to 3, the oscillator 1 is configured to include an oscillation integrated circuit (IC) 2, a resonator 3, a package 4, a lid (cap) 5, and external terminals (external electrodes) 6. In the present embodiment, although the resonator 3 is a quartz crystal resonator, for example, a surface acoustic wave (SAW) resonator, another piezoelectric resonator, a micro electro mechanical systems (MEMS) resonator, or the like may be used. Further, as a substrate material of the resonator 3, a piezoelectric single crystal such as quartz crystal, lithium tantalate, or lithium niobate, a piezoelectric material such as piezoelectric ceramics such as lead zirconate titanate, or a silicon semiconductor material can be used. As an excitation element of the resonator 3, one by a piezoelectric effect may be used, and an electrostatic drive by a Coulomb force may be used.

The package 4 accommodates the oscillation IC 2 and the resonator 3 in the same space. Specifically, the package 4 is provided with a recess portion, and serves as a housing chamber 7 by covering the recess portion with a lid 5. Wiring (not illustrated) for electrically connecting each of two terminals (an XG terminal and an XD terminal illustrated in FIG. 3 to be described later) of the oscillation IC 2 and each of two terminals (excitation electrodes 3a and 3b) of the resonator 3, is provided inside of the package 4 or on the surface of the recess portion. In addition, wiring (not illustrated) for electrically connecting each of the terminals of the oscillation IC 2 and the corresponding external terminal 6, is provided inside of the package 4 or on the surface of the recess portion.

The resonator 3 includes metal excitation electrodes 3a and 3b on the front and back surfaces thereof, and oscillates at a desired frequency (frequency required for the oscillator 1) according to the shape and mass of the resonator 3 including the excitation electrodes 3a and 3b.

As illustrated in FIG. 3, the oscillator 1 is provided with four external terminals 6 of an external terminal VCC as a power supply terminal, an external terminal GND as a ground terminal, an external terminal OE as an input/output terminal, and an external terminal OUT as an input/output terminal, which are provided on the bottom surface of the oscillator 1 (the back surface of the package 4). The power supply voltage is supplied to the external terminal VCC, and the external terminal GND is grounded.

Figure 4:
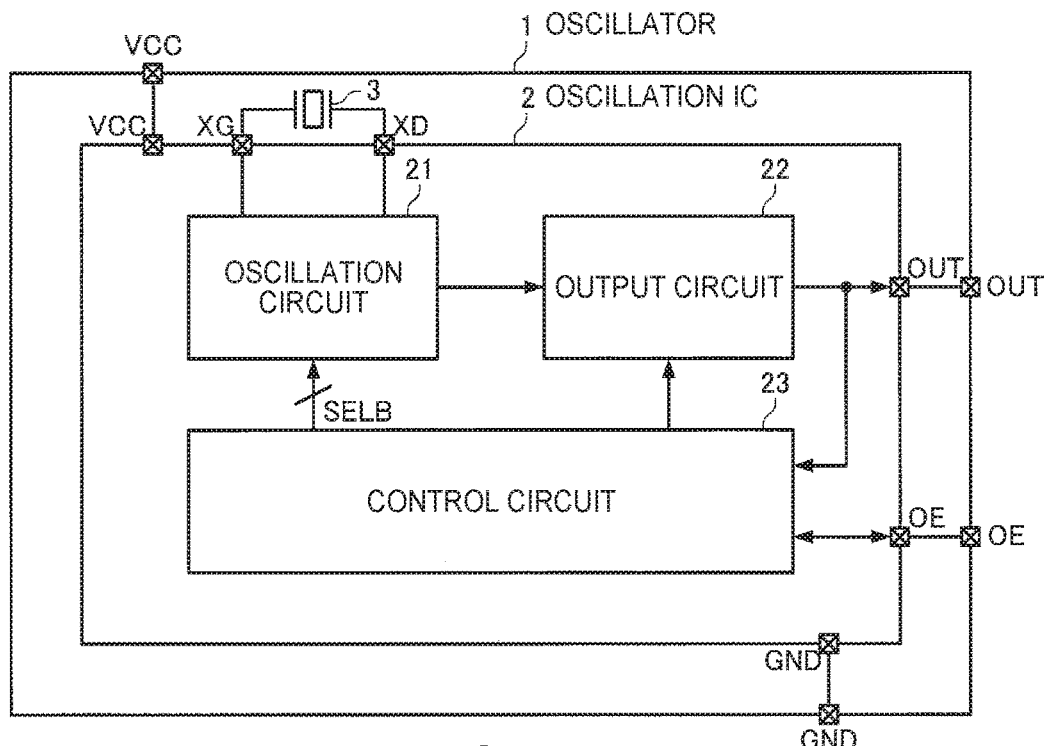
FIG. 4 is a functional block diagram of the oscillator according to the present embodiment.

FIG. 4 is a functional block diagram of the oscillator 1 according to the present embodiment. As illustrated in FIG. 4, the oscillator 1 according to the first embodiment is configured to include the oscillation IC 2 and the resonator 3. The oscillation IC 2 is provided with a VCC terminal as a power supply terminal, a GND terminal as a ground terminal, an OE terminal as an input/output terminal, an OUT terminal as an input/output terminal, and an XG terminal and an XD terminal as connection terminals for connection with the resonator 3. The VCC terminal, the GND terminal, the OE terminal, and the OUT terminal are exposed on the surface of the oscillation IC 2, and are respectively connected to the external terminals VCC, GND, OE, and OUT of the oscillator 1 provided in the package 4. In addition, the XG terminal is connected to one end (one terminal) of the resonator 3, and the XD terminal is connected to the other end (the other terminal) of the resonator 3.

The oscillator 1 according to the present embodiment does not include an external terminal which is electrically connected to wiring for connecting the resonator 3 and an oscillation circuit 21. That is, although an inspection terminal for directly inspecting a crystal impedance (CI) value of the resonator 3 by probing is not exposed to the outside, the oscillator 1 is configured to allow inspection of the CI value of the resonator 3. This detailed configuration will be described later.

In the present embodiment, the oscillation IC 2 is configured to include an oscillation circuit 21, an output circuit 22, and a control circuit 23. The oscillation IC 2 may have a configuration in which a part of the components is omitted or changed, or in which another component is added.

The oscillation circuit 21 oscillates the resonator 3 by amplifying the output signal of the resonator 3 that is input from the XG terminal of the oscillation IC 2 using an amplification circuit (not illustrated in FIG. 4) and feeding the amplified signal back into the resonator 3 via the XD terminal of the oscillation IC 2, and outputs an oscillation signal based on the oscillation of the resonator 3.

The output circuit 22 receives the oscillation signal output from the oscillation circuit 21, and generates an oscillation signal of which the amplitude is adjusted to a desired level. The oscillation signal generated by the output circuit 22 is output to the outside of the oscillator 1 via the OUT terminal of the oscillation IC 2 and the external terminal OUT of the oscillator 1.

The control circuit 23 is a circuit for controlling the operation of the oscillation circuit 21 and the output circuit 22. In addition, the control circuit 23 sets, based on a control signal which is input from the external terminal of the oscillator 1 via the terminal of the oscillation IC 2, an operation mode of the oscillator 1 (oscillation IC 2) to one of a plurality of modes including an external communication mode, a normal operation mode, and a CI value inspection mode, and performs a control according to the set operation mode. In the present embodiment, in a case where a control signal with a predetermined pattern is input from the external terminal OE of the oscillator 1 (OE terminal of the oscillation IC 2) within a predetermined period after the start of supply of the power supply voltage to the external terminal VCC of the oscillator 1 (VCC terminal of the oscillation IC 2) (that is, within a predetermined period after the power is supplied), after the predetermined period elapses, the control circuit 23 sets the operation mode of the oscillator 1 (oscillation IC 2) to the external communication mode. For example, the control circuit 23 may set, a period for which the resonator 3 starts to oscillate by power supply from the oscillator 1 (oscillation IC 2) and it is detected that the oscillation is stabilized (for example, the oscillation signal reaches a desired amplitude), as the predetermined period. In addition, the control circuit 23 may count the number of pulses of the oscillation signal and determine that the predetermined period elapses when the count value reaches a predetermined value. Further, for example, the control circuit 23 may measure the predetermined period based on an output signal of a RC time constant circuit that starts to operate when the power from the oscillator 1 (oscillation IC 2) is supplied.

In the external communication mode, as the control signal, a serial clock signal and a serial data signal are input in synchronization with each other from the external terminals OE and OUT of the oscillator 1 (OE and OUT terminals of the oscillation IC 2). In addition, the control circuit 23 performs sampling of the serial data signal for each edge of the serial clock signal, based on, for example, inter-integrated circuit ($I^2C$) bus standard, and performs processing such as setting of the operation mode, and setting of control data in each operation mode, based on a command and data which are subjected to sampling. For example, the control circuit 23 sets the operation mode of the oscillator 1 (oscillation IC 2) to the corresponding mode by sampling a command for transition of the operation mode of the oscillator 1 (oscillation IC 2) to the corresponding mode (the normal operation mode, the CI value inspection mode, or the like).

In the normal operation mode, when the control signal (output enable signal) input from the external terminal OE of the oscillator 1 (OE terminal of the oscillation IC 2) is active (for example, high level), the control circuit 23 performs a control to operate the oscillation circuit 21 and the output circuit 22. Accordingly, the oscillation signal is output from the external terminal OUT of the oscillator 1 (OUT terminal of the oscillation IC 2).

In addition, in the normal operation mode, when the control signal (output enable signal) input from the external terminal OE of the oscillator 1 (OE terminal of the oscillation IC 2) is inactive (for example, low level), the control circuit 23 operates the oscillation circuit 21, and performs a control to stop the operation of the output circuit 22 in a case where standby bit data stored in a nonvolatile memory (not illustrated) is inactive (for example, 0). In a case where the standby bit data is active (for example, 1), the control circuit 23 performs a control to stop the operation of the oscillation circuit 21 and the operation of the output circuit 22. In any case of these cases, output of the oscillation signal from the external terminal OUT of the oscillator 1 (OUT terminal of the oscillation IC 2) is stopped.

In a case where the control signal with a predetermined pattern is not input from the external terminal OE of the oscillator 1 (OE terminal of the oscillation IC 2) within a predetermined period after the power is supplied), after the predetermined period elapses, the control circuit 23 directly sets the operation mode of the oscillator 1 (oscillation IC 2) to the normal operation mode instead of the external communication mode.

Further, in the CI value inspection mode, the control circuit 23 sets oscillation current of the oscillation circuit 21 according to values of m-bit current selection data SELB obtained by converting n-bit oscillation current setting data IOSC stored in an internal register (not illustrated), and performs a control to operate the oscillation circuit 21 and the output circuit 22. At this time, when a negative resistance value of the oscillation circuit 21 is larger than the CI value of the resonator 3, the resonator 3 oscillates, and an oscillation signal is output from the external terminal OUT of the oscillator 1 (OUT terminal of the oscillation IC 2). On the other hand, when the negative resistance value of the oscillation circuit 21 is smaller than the CI value of the resonator 3, the resonator 3 does not oscillate, and an oscillation signal is not output from the external terminal OUT of the oscillator 1 (OUT terminal of the oscillation IC 2).

In the present embodiment, in a case where the oscillation current is set to the lower limit (minimum value) of a variable range according to the oscillation current setting data IOSC, the resonator 3 does not oscillate, and in a case where the oscillation current is set to the upper limit (maximum value) of a variable range according to the oscillation current setting data IOSC, the resonator 3 oscillates. Therefore, in the CI value inspection mode, it is possible to search a setting value of the oscillation current setting data IOSC, which is a boundary between when the resonator 3 oscillates and when the resonator 3 stops oscillation.

In the CI value inspection mode, each time a pulse is input from the external terminal OE of the oscillator 1 (OE terminal of the oscillation IC 2), the control circuit 23 changes the value of the oscillation current setting data IOSC such that, for example, the oscillation current is lowered by one level. In addition, when the power is supplied, the oscillation current setting data IOSC is initialized to a value that maximizes the oscillation current. Accordingly, even in a case where the oscillator 1 transitions to the normal operation mode without passing through the external communication mode, the oscillator 1 can reliably start to oscillate.

Configuration of Oscillation Circuit

Figure 5:
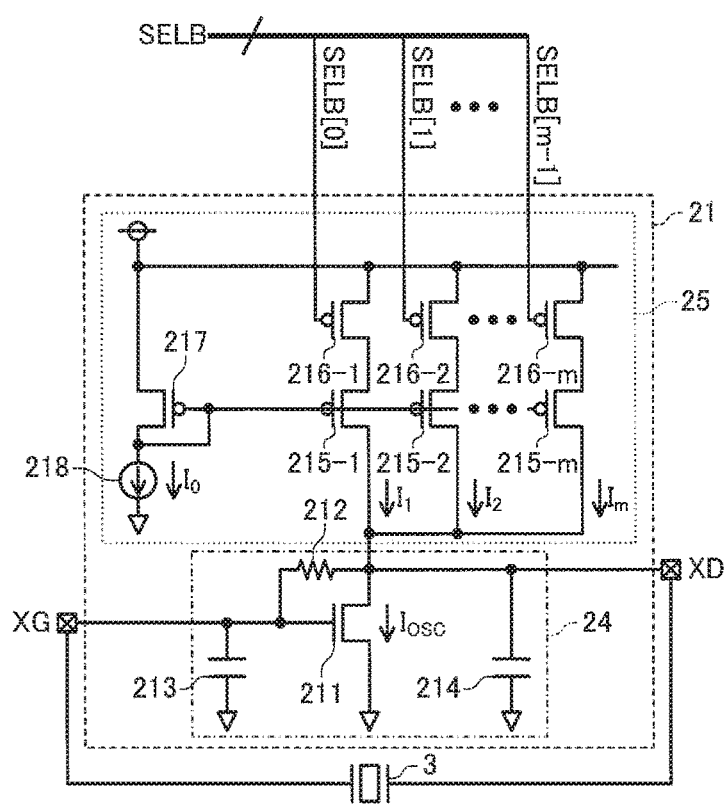
FIG. 5 is a diagram illustrating a configuration example of an oscillation circuit in an oscillator according to a first embodiment.

FIG. 5 is a diagram illustrating a configuration example of the oscillation circuit 21 in the oscillator 1 according to a first embodiment. In FIG. 5, connection between the oscillation circuit 21 and the resonator 3 is also illustrated, and a so-called pierce oscillation circuit is configured with the oscillation circuit 21 and the resonator 3. As illustrated in FIG. 5, the oscillation circuit 21 is configured to include a negative-channel metal oxide semiconductor (NMOS) transistor 211, a resistor 212, a capacitor 213, a capacitor 214, m positive-channel metal oxide semiconductor (PMOS) transistors 215-1 to 215-$m$, m PMOS transistors 216-1 to 216-$m$, a PMOS transistor 217, and a constant current source 218. The oscillation circuit 21 may have a configuration in which a part of the components is omitted or changed, or in which another component is added.

The gate terminal of the NMOS transistor 211 is electrically connected to the XG terminal, the drain terminal of the NMOS transistor 211 is electrically connected to the XD terminal, and the source terminal of the NMOS transistor 211 is grounded to an analog ground.

One end of the resistor 212 is electrically connected to the XG terminal, and the other end of the resistor 212 is electrically connected to the XD terminal. That is, both ends of the resistor 212 are electrically connected to the gate terminal and the drain terminal of the NMOS transistor 211, respectively.

One end of the capacitor 213 is electrically connected to the XG terminal, and the other end of the capacitor 213 is grounded to the analog ground.

One end of the capacitor 214 is electrically connected to the XD terminal, and the other end of the capacitor 214 is grounded to the analog ground.

Each of the gate terminals of the PMOS transistors 215-1 to 215-$m$ is electrically connected to the gate terminal of the PMOS transistor 217 in common. Each of the source terminals of the PMOS transistors 215-1 to 215-$m$ is electrically connected to each of the drain terminals of the PMOS transistors 216-1 to 216-$m$, respectively. Each of the drain terminals of the PMOS transistors 215-1 to 215-$m$ is electrically connected to the drain terminal of the NMOS transistor 211 in common.

A voltage having a level (low level or high level) corresponding to a value (0 or 1) of each bit of the m-bit current selection data SELB is respectively applied to each of the gate terminals of the PMOS transistors 216-1 to 216-$m$. Each of the source terminals of the PMOS transistors 216-1 to 216-$m$ is electrically connected to an analog power supply in common. Each of the drain terminals of the PMOS transistors 216-1 to 216-$m$ is electrically connected to each of the source terminals of the PMOS transistors 215-1 to 215-$m$, respectively.

The gate terminal of the PMOS transistor 217 is electrically connected to each of the gate terminals of the PMOS transistors 215-1 to 215-$m$ in common, the source terminal of the PMOS transistor 217 is electrically connected to the analog power supply, and the drain terminal of the PMOS transistor 217 is connected to one end of the constant current source 218.

One end of the constant current source 218 is electrically connected to the drain terminal of the PMOS transistor 217, and the other end of the constant current source 218 is grounded to the analog ground.

In the oscillation circuit 21 having such a configuration, the capacitor 213 and the capacitor 214 function as a load capacitor, the resistor 212 functions as a feedback resistor, and the NMOS transistor 211 functions as an amplification element that amplifies the oscillation signal input from the resonator 3 via the XG terminal and outputs the amplified signal to the resonator 3 via the XD terminal. That is, an amplification circuit 24 is configured with the NMOS transistor 211, the resistor 212, the capacitor 213, and the capacitor 214.

In addition, a current mirror circuit is configured with the PMOS transistors 215-1 to 215-$m$, the PMOS transistors 216-1 to 216-$m$, the PMOS transistor 217, and the constant current source 218. Therefore, assuming that the size ratios between each of the PMOS transistors 215-1 to 215-$m$ and the PMOS transistor 217 are respectively $N_1$ to $N_m$, when each of the PMOS transistors 216-1 to 216-$m$ is in an ON state (a state where the source terminals and the drain terminals thereof are electrically connected to each other), currents $I_1$ to $I_m$, which are $N_1$ to $N_m$ times the current $I_0$ flowing through the PMOS transistor 217 (current flowing through the constant current source 218), flow from each of the source terminals of the PMOS transistors 215-1 to 215-$m$ to each of the drain terminals of the PMOS transistors 215-1 to 215-$m$. On the other hand, when each of the PMOS transistors 216-1 to 216-$m$ is in an OFF state (a state where the source terminals and the drain terminals thereof are not electrically connected to each other), no current flows from each of the source terminals of the PMOS transistors 215-1 to 215-$m$ to each of the drain terminals of the PMOS transistors 215-1 to 215-$m$. Here, when a value of each of the bits SELB[0] to SELB[m−1] of the current selection data SELB is 0, each of the PMOS transistors 216-1 to 216-$m$ enters an ON state, and when a value of each of the bits SELB[0] to SELB[m−1] is 1, each of the PMOS transistors 216-1 to 216-$m$ enters an OFF state.

The oscillation current $I_{OSC}$, which flows from the drain terminal of the NMOS transistor 211 to the source terminal of the NMOS transistor 211, is the sum of the currents flowing from each of the source terminals of the PMOS transistors 215-1 to 215-$m$ to each of the drain terminals of the PMOS transistors 215-1 to 215-$m$, and thus the oscillation current $I_{OSC}$ is represented by the following equation (1).

$$I_{OSC} = \overline{SELB[0]} \cdot I_1 + \overline{SELB[1]} \cdot I_2 + \ldots + \overline{SELB[m-1]} \cdot I_m \quad (1)$$

In this manner, a current source 25 that supplies the oscillation current $I_{OSC}$ to the amplification circuit 24 is configured with the PMOS transistors 215-1 to 215-$m$, the PMOS transistors 216-1 to 216-$m$, the PMOS transistor 217, and the constant current source 218. Specifically, the current source 25 supplies the oscillation current $I_{OSC}$ to the drain terminal of the NMOS transistor 211 included in the amplification circuit 24.

The oscillation current $I_{OSC}$ supplied to the amplification circuit 24 is variably set according to the control signal input from the external terminal of the oscillator 1. That is, as described above, in the CI value inspection mode, a control signal including at least one pulse is input from the external terminal OE of the oscillator 1 (OE terminal of the oscillation IC 2), and each time the pulse is respectively input, the setting value of the oscillation current $I_{OSC}$ is switched. For example, the oscillation current $I_{OSC}$ is lowered by one level.

Figure 6:
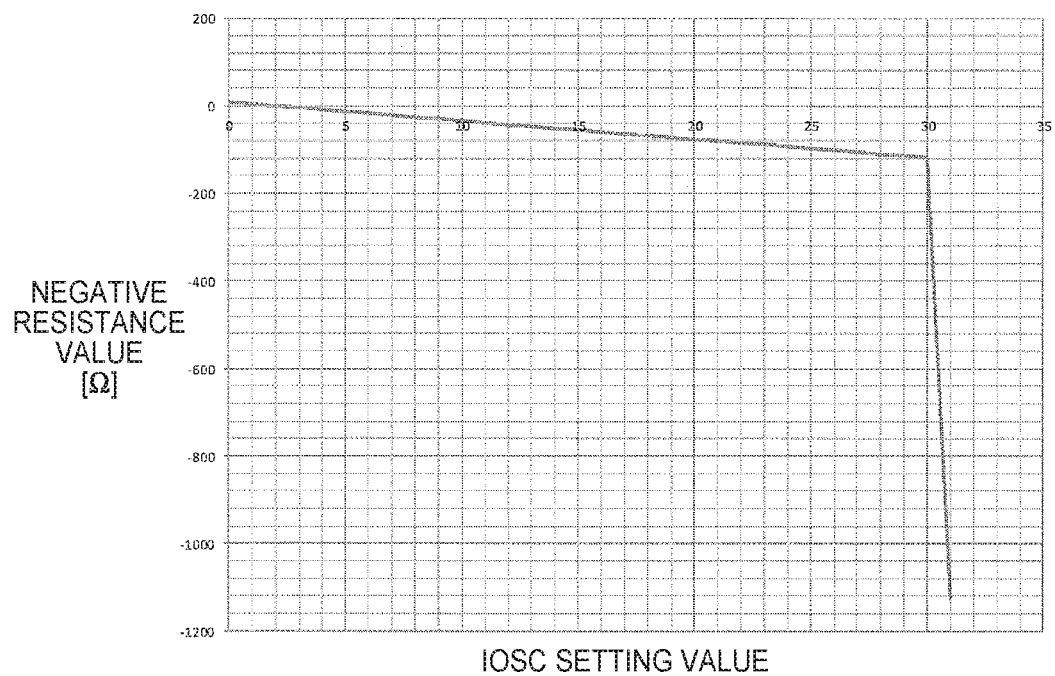
FIG. 6 is a diagram illustrating an example of a relationship between a setting value of oscillation current setting data and a negative resistance value of an oscillation circuit.

In the present embodiment, as the setting value of the oscillation current setting data IOSC becomes larger, the oscillation current $I_{OSC}$ becomes larger, and as the oscillation current $I_{OSC}$ becomes larger, the negative resistance value of the oscillation circuit 21 becomes larger. Therefore, as the setting value of the oscillation current setting data IOSC becomes larger, the negative resistance value of the oscillation circuit 21 becomes larger. FIG. 6 is a diagram illustrating an example of a relationship between the setting value of the oscillation current setting data IOSC and the negative resistance value of the oscillation circuit 21. In FIG. 6, the horizontal axis represents the setting value of the 5-bit oscillation current setting data IOSC (denoted by a decimal number), and the vertical axis represents the negative resistance value [Ω] when the oscillation frequency is 26 MHz.

In the example of FIG. 6, when the setting value of the oscillation current setting data IOSC is 31 (all of 5 bits are 1), the negative resistance value of the oscillation circuit 21 becomes the maximum value and exceeds 1000Ω. Therefore, for example, when the CI value of the resonator 3 is approximately 30Ω to 80Ω, in a case where the setting value of the oscillation current setting data IOSC is 31 (in a case where the oscillation current $I_{OSC}$ is set to the upper limit of a variable range (in a case where the negative resistance value is set to the lower limit of a variable range)), the negative resistance value of the oscillation circuit 21 is significantly larger than the CI value of the resonator 3, and thus the resonator 3 can be reliably oscillated. Accordingly, in the present embodiment, in the case of the example of FIG. 6, the oscillation current setting data IOSC is set to 31 (a value that maximizes the oscillation current $I_{OSC}$) in the normal operation mode. In addition, even in a case where the power is supplied from the oscillator 1 (oscillation IC 2), the oscillation current setting data IOSC is initialized to 31. Thus, even when the oscillator 1 transitions to the normal operation mode without passing through the external communication mode, the oscillator 1 can reliably start to oscillate.

In the example of FIG. 6, when the setting value of the oscillation current setting data IOSC is 30, the negative resistance value of the oscillation circuit 21 is approximately 120Ω and is larger than the CI value (approximately 30Ω to 80Ω) of the resonator 3, and thus the resonator 3 can be oscillated. On the other hand, when the setting value of the oscillation current setting data IOSC is 0 (in a case where the oscillation current $I_{OSC}$ is set to the lower limit of a variable range (in a case where the negative resistance value is set to the upper limit of a variable range)), the negative resistance value of the oscillation circuit 21 is approximately 0Ω and is smaller than the CI value (approximately 30Ω to 80Ω) of the resonator 3, and thus the resonator 3 does not oscillate. When the setting value of the oscillation current setting data IOSC is in a range from 30 to 0, each time the setting value of the oscillation current setting data IOSC is lowered by 1, the negative resistance value almost linearly decreases by approximately 4Ω to 5Ω. Therefore, in the CI value inspection mode, it is possible to search the setting value of the oscillation current setting data IOSC (negative resistance value), which is a boundary between when the resonator 3 oscillates and when the resonator 3 stops oscillation, by changing the setting value of the oscillation current setting data IOSC in a range from 30 to 0.

Manufacturing Method of Oscillator

Figure 7:
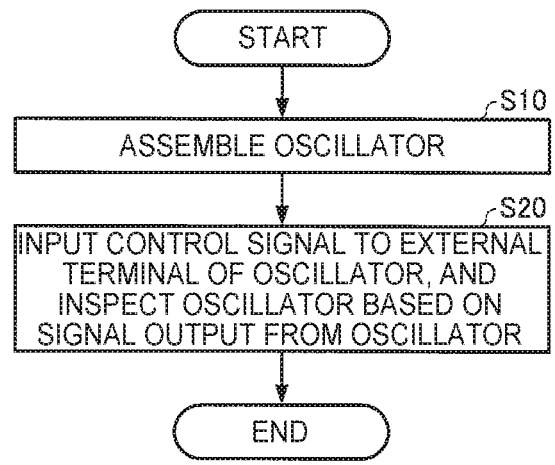
FIG. 7 is a flowchart illustrating an example of a method of manufacturing the oscillator according to the present embodiment.

FIG. 7 is a flowchart illustrating an example of a method of manufacturing the oscillator according to the present embodiment. The method of manufacturing the oscillator according to the present embodiment includes steps S10 to S20 illustrated in FIG. 7. In the method of manufacturing the oscillator according to the present embodiment, apart of steps S10 to S20 may be omitted or changed, or other steps may be added.

As illustrated in FIG. 7, in the present embodiment, first, the oscillator 1 including the resonator 3 and the oscillation IC 2 is assembled (step S10).

Next, a control signal is input to the external terminal of the oscillator 1, and the oscillator 1 is inspected based on a signal output from the oscillator 1 (step S20).

Figure 8:
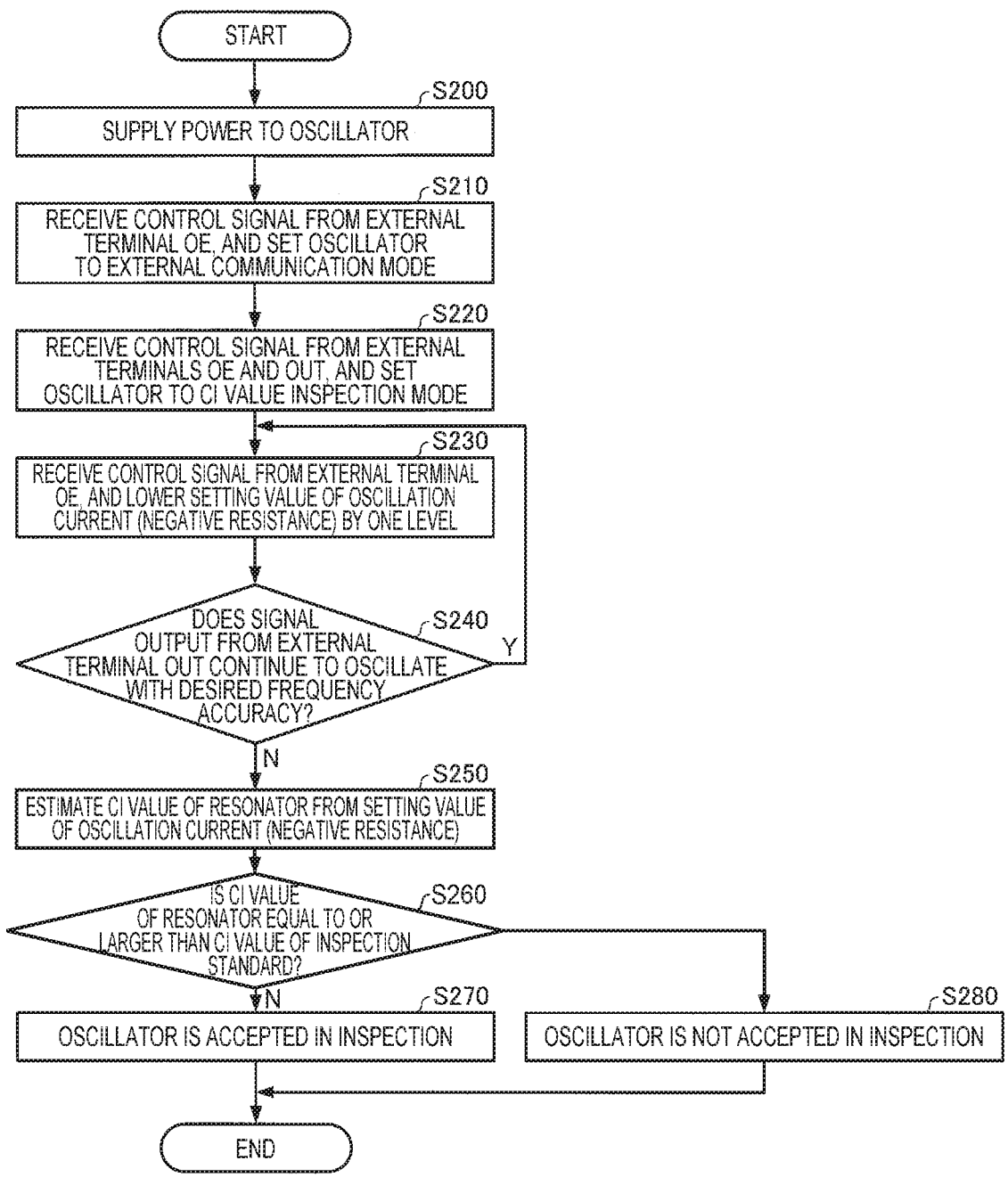
FIG. 8 is a flowchart illustrating an example of a detailed procedure (a method of inspecting the oscillator) in step S20 of FIG. 7.
Figure 9:
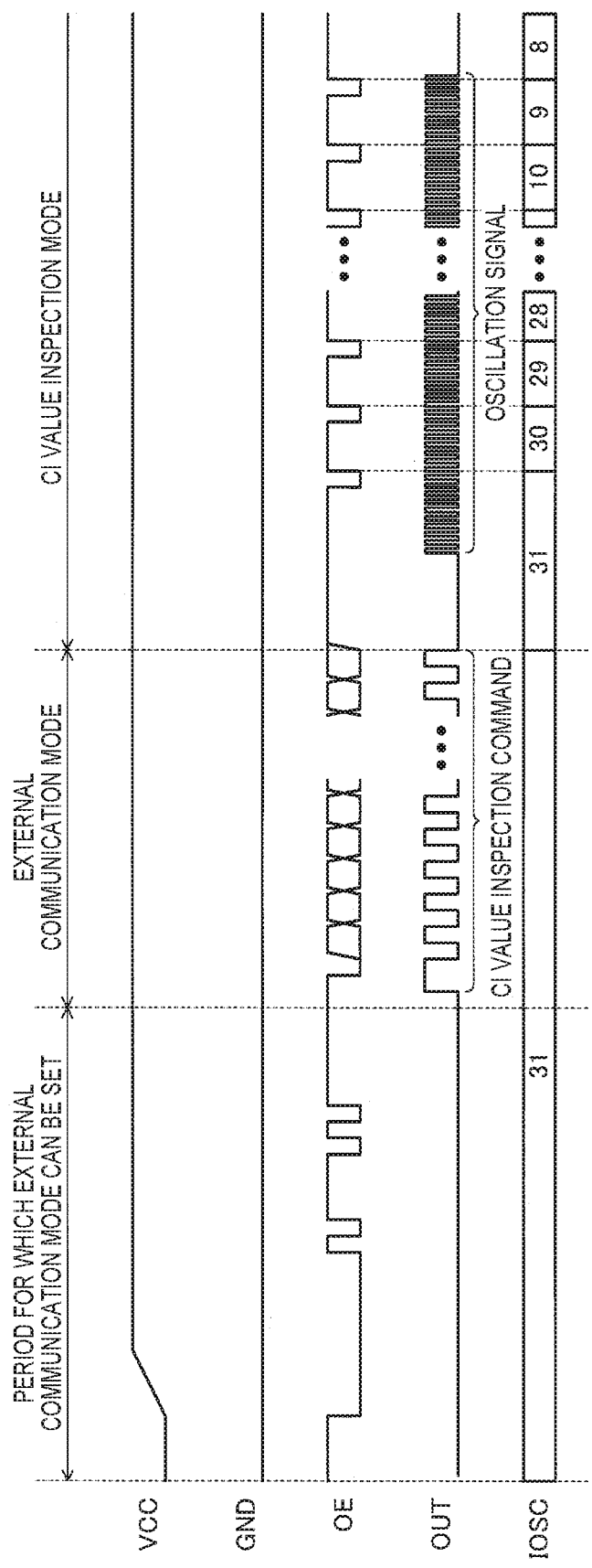
FIG. 9 is a diagram illustrating an example of signal waveforms of external terminals of the oscillator when inspecting the oscillator according to the flowchart of FIG. 8.

FIG. 8 is a flowchart illustrating an example of a detailed procedure (a method of inspecting the oscillator) in step S20 of FIG. 7. FIG. 9 is a diagram illustrating an example of signal waveforms of external terminals VCC, GND, OE, and OUT of the oscillator 1 when inspecting the oscillator 1 according to the flowchart of FIG. 8. Further, FIG. 9 illustrates an example of the case where the setting value of the oscillation current setting data IOSC and the negative resistance value of the oscillation circuit 21 are in the relation illustrated in FIG. 6.

In the example of FIG. 8, first, the power is supplied to the oscillator 1 (step S200). That is, as illustrated in FIG. 9, a desired power supply voltage is supplied to the external terminal VCC of the oscillator 1.

Next, a control signal is received from the external terminals OE and OUT, and the oscillator 1 is set to the external communication mode (step S210). That is, as illustrated in FIG. 9, within a predetermined period after the power is supplied, a predetermined signal with a predetermined pattern is input to the external terminal OE of the oscillator 1, and the oscillator 1 is set to the external communication mode.

Next, a control signal is received from the external terminals OE and OUT, and the oscillator 1 is set to the CI value inspection mode (step S220). That is, as illustrated in FIG. 9, in the external communication mode, a serial clock signal and a serial data signal (CI value inspection command) are respectively received from the external terminals OE and OUT of the oscillator 1, and the oscillator 1 is set to the CI value inspection mode.

Next, a control signal is received from the external terminal OE, and the setting value of the oscillation current (negative resistance) is lowered by one level (step S230). That is, as illustrated in FIG. 9, in the CI value inspection mode, a pulse is received from the external terminal OE of the oscillator 1, and the value of the oscillation current setting data IOSC is lowered from 31 (initial value) to 30.

Next, it is determined whether or not the signal output from the external terminal OUT continues to oscillate with desired frequency accuracy (step S240). In a case where the signal output from the external terminal OUT continues to oscillate with desired frequency accuracy (Y in step S240), steps S230 and S240 are performed again. In the example of FIG. 9, pulses are received from the external terminal OE of the oscillator 1, and each time the value of the oscillation current setting data IOSC is lowered from 29 to 8 by one level, it is determined whether or not the signal output from the external terminal OUT continues to oscillate with desired frequency accuracy.

In a case where the signal output from the external terminal OUT does not continue to oscillate with desired frequency accuracy (N in step S240), the CI value of the resonator 3 is estimated from the setting value of the oscillation current (negative resistance) in step S230 (step S250). In the example of FIG. 9, since the oscillation is stopped when the value of the oscillation current setting data IOSC is 8, the negative resistance value when the value of the oscillation current setting data IOSC is 8 is obtained from the relationship of FIG. 6, and thus the CI value of the resonator 3 is estimated from the negative resistance value. For example, the CI value of the resonator 3 may be estimated as a value which matches the negative resistance value.

For the relationship between the setting value of the oscillation current setting data IOSC and the negative resistance value of the oscillation circuit 21, which is illustrated in FIG. 6, the relationship may be once calculated by obtaining relationships for a plurality of prototypes of the oscillator 1 at a stage of design evaluation and averaging the relationships, and it is not necessary to calculate the relationship for each oscillator 1 in the process of manufacturing the oscillator 1.

In a case where the CI value of the resonator 3 estimated in step S250 is smaller than the CI value of the inspection standard (N in step S260), it is determined that the oscillator 1 is accepted in the inspection, and in a case where the CI value of the resonator 3 estimated in step S250 is equal to or larger than the CI value of the inspection standard (Y in step S260), it is determined that the oscillator 1 is not accepted in the inspection (step S280).

Figure 10:
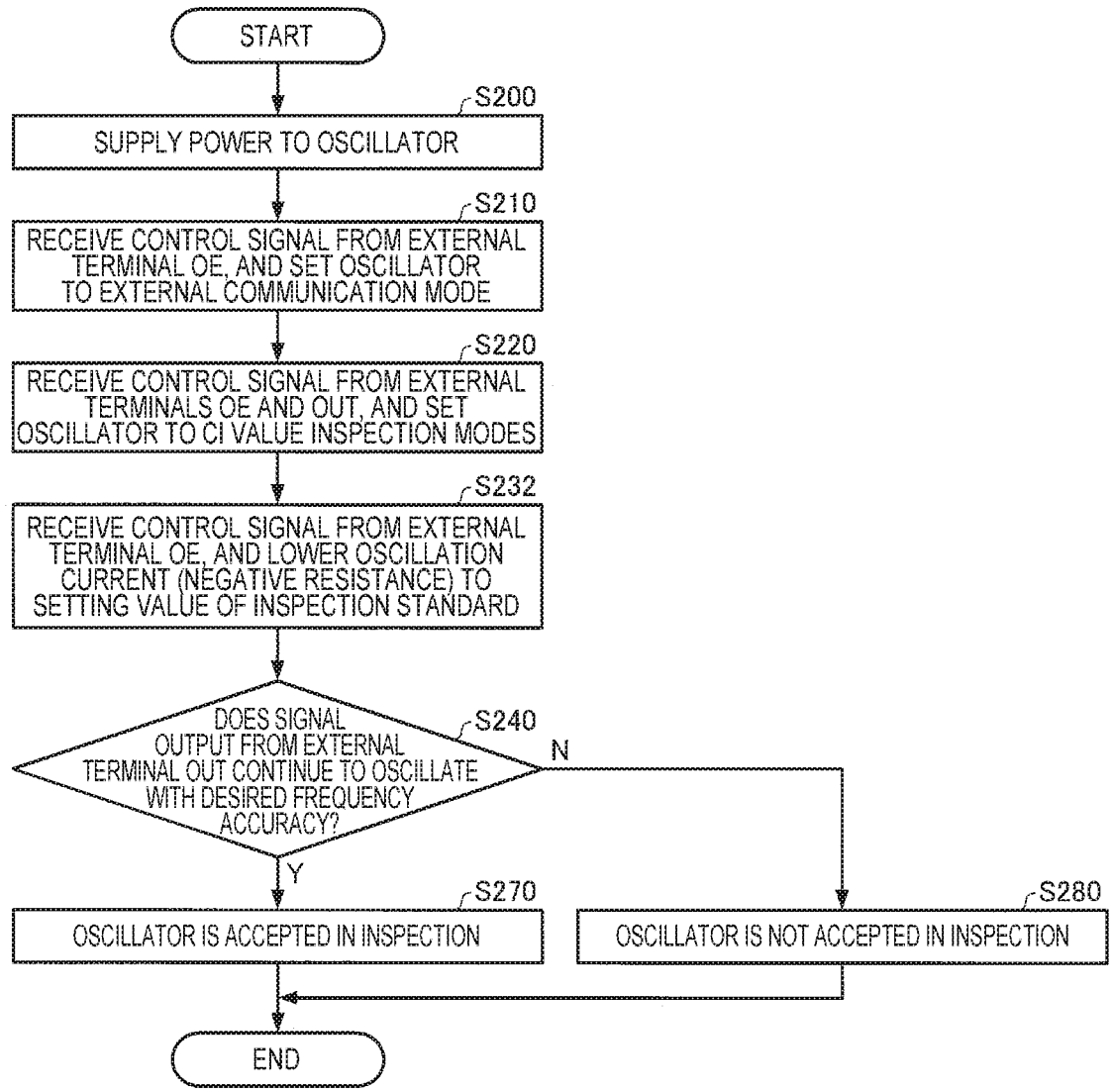
FIG. 10 is a flowchart illustrating another example of a detailed procedure (a method of inspecting the oscillator) in step S20 of FIG. 7.
Figure 11:
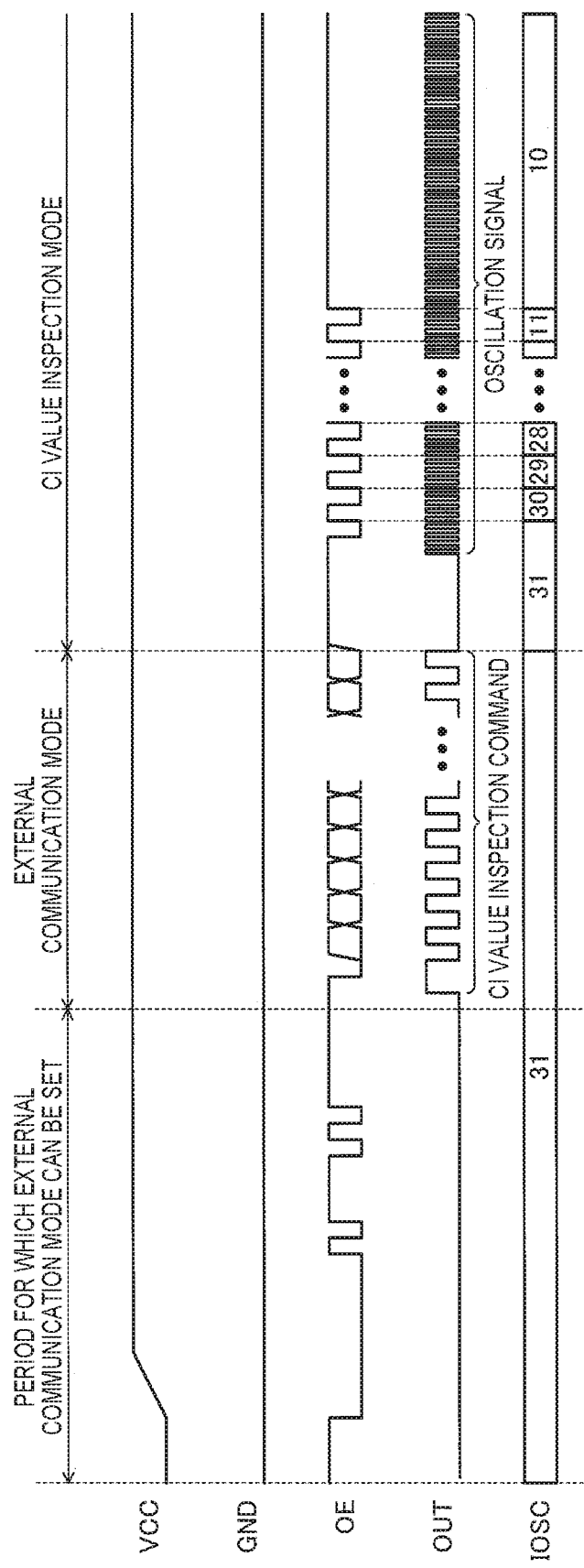
FIG. 11 is a diagram illustrating an example of signal waveforms of external terminals of the oscillator when inspecting the oscillator according to the flowchart of FIG. 10.

FIG. 10 is a flowchart illustrating another example of a detailed procedure (a method of inspecting the oscillator) in step S20 of FIG. 7. FIG. 11 is a diagram illustrating an example of signal waveforms of external terminals VCC, GND, OE, and OUT of the oscillator 1 when inspecting the oscillator 1 according to the flowchart of FIG. 10. Further, FIG. 11 illustrates an example of the case where the setting value of the oscillation current setting data IOSC and the negative resistance value of the oscillation circuit 21 are in the relation illustrated in FIG. 6. In FIG. 10, the same steps as those in FIG. 8 are denoted by the same reference numerals, and the description overlapping with that of FIG. 8 will be simplified or omitted below.

In the example of FIG. 10, similarly to FIG. 8, first, steps S200 to S220 are performed.

Next, a control signal is received from the external terminal OE, and the oscillation current (negative resistance) is lowered to the setting value of the inspection standard (step S232). That is, as illustrated in FIG. 11, in the CI value inspection mode, a predetermined number of pulses are received from the external terminal OE of the oscillator 1, and the value of the oscillation current setting data IOSC is lowered from 31 (initial value) to the setting value (for example, 10) of the inspection standard.

Next, it is determined whether or not the signal output from the external terminal OUT continues to oscillate with desired frequency accuracy (step S240). In a case where the signal output from the external terminal OUT continues to oscillate with desired frequency accuracy (Y in step S240), it is determined that the oscillator 1 is accepted in the inspection, and in a case where the signal output from the external terminal OUT does not continue to oscillate with desired frequency accuracy (N in step S240), it is determined that the oscillator 1 is not accepted in the inspection (step S280).

In the example of FIG. 11, in the CI value inspection mode, a predetermined number of pulses are received from the external terminal OE of the oscillator 1, and the value of the oscillation current setting data IOSC is lowered to the setting value of the inspection standard. On the other hand, as an initial value of the oscillation current setting data IOSC in the CI value inspection mode, the value of the oscillation current setting data IOSC in the CI value inspection mode, which is included in the CI value inspection command input in the external communication mode, may be set to the setting value of the inspection standard. In this way, in the CI value inspection mode, it is possible to save labor and time for inputting a predetermined number of pulses.

Operation and Effect

As described above, in the oscillator 1 according to the first embodiment, the negative resistance value of the oscillation circuit 21 is changed according to the oscillation current $I_{OSC}$ which is variably set by the control signal input from the external terminals OE and OUT (current flowing from the drain terminal of the NMOS transistor 211 to the source terminal of the NMOS transistor 211, the NMOS transistor 211 being included in the oscillation circuit 21), and in a case where the CI value of the resonator 3 is larger than the negative resistance value, the oscillation of the resonator 3 is stopped. Specifically, as the oscillation current $I_{OSC}$ is set to a larger value, the degree of oscillation margin increases and the oscillation of the resonator 3 is more likely to be stabilized. In contrast, as the oscillation current $I_{OSC}$ is set to a smaller value, the degree of oscillation margin decreases and the oscillation of the resonator 3 is likely to be stopped. Therefore, according to the first embodiment, it is possible to inspect the CI value of the resonator 3 by observing the signal output from the external terminal OUT of the oscillator 1 (signal of the drain terminal of the NMOS transistor 211).

In addition, in the oscillator 1 according to the first embodiment, since the external terminals OE and OUT which are used in the normal operation mode are also used as terminals for inspecting the CI value, dedicated inspection terminals for inspecting the CI value of the resonator 3 by probing at both ends of the resonator 3 (inspection terminals electrically connected to both ends of the resonator 3) are not provided. Therefore, according to the first embodiment, it is possible to reduce the size of the oscillator 1 and reduce a risk of breakdown of the oscillation circuit 21 due to input of static electricity via the external terminal.

Further, in the oscillator 1 according to the first embodiment, in a case where the oscillation current $I_{OSC}$ is set to the lower limit (minimum value) of a variable range, since the negative resistance value of the oscillation circuit 21 becomes smaller than the CI value of the resonator 3, the resonator 3 does not oscillate, and in a case where the oscillation current $I_{OSC}$ is set to the upper limit (maximum value) of a variable range, since the negative resistance value of the oscillation circuit 21 becomes larger than the CI value of the resonator 3, the resonator 3 oscillates. Therefore, according to the first embodiment, in a variable range of the oscillation current $I_{OSC}$, it is possible to search the setting value of the oscillation current $I_{OSC}$, which is a boundary between when the resonator 3 oscillates and when the resonator stops oscillation, and it is possible to estimate the impedance value of the resonator based on the setting value of the oscillation current which is the boundary.

Furthermore, in the oscillator 1 according to the first embodiment, in the CI value inspection mode, the setting value of the oscillation current $I_{OSC}$ (negative resistance value of the oscillation circuit 21) is switched each time a pulse is input from the external terminal OE. Therefore, according to the first embodiment, it is possible to shorten a time required for inspecting the CI value of the resonator 3, by observing the signal output from the external terminal OUT each time a pulse is input to the external terminal OE of the oscillator 1.

1-2. Second Embodiment

An oscillator 1 according to a second embodiment is configured to allow inspection of a drive level of the oscillator 1 as well as inspection of the CI value of the resonator 3. Hereinafter, in the oscillator 1 according to the second embodiment, the same description as in the first embodiment will be omitted or simplified, and contents different from those of the first embodiment will mainly be described. Since a structure and a functional block diagram of the oscillator 1 according to the second embodiment are the same as those of the oscillator 1 according to the first embodiment (FIGS. 1 to 4), the illustration and description thereof will be omitted.

Figure 12:
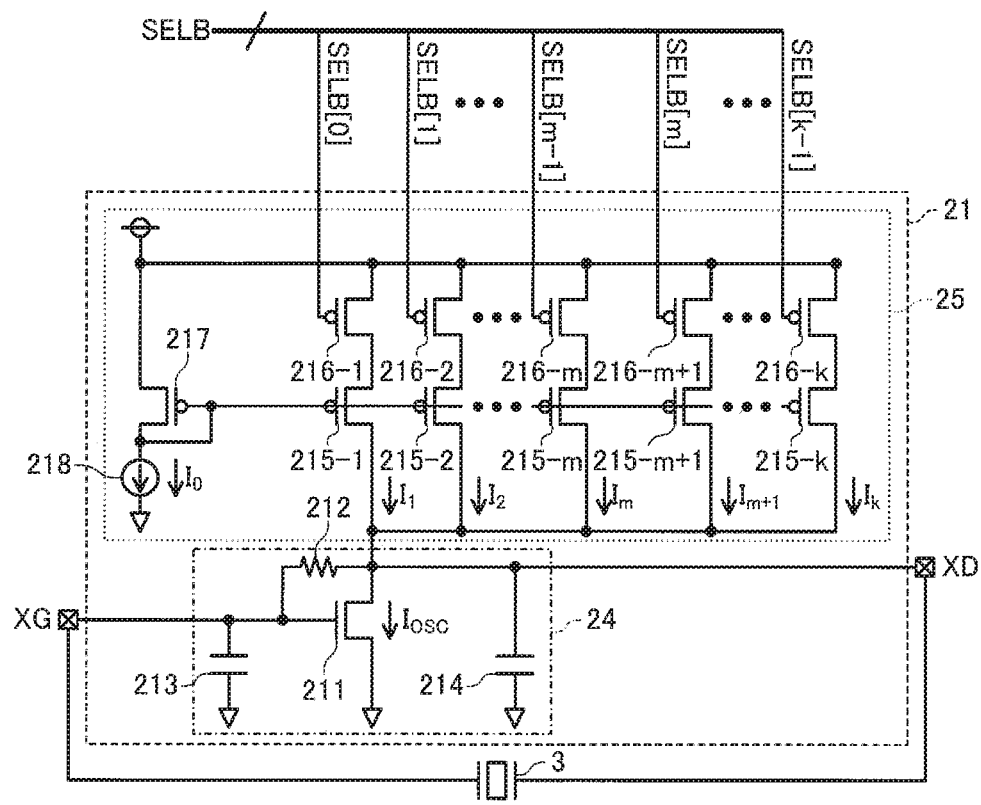
FIG. 12 is a diagram illustrating a configuration example of an oscillation circuit in an oscillator according to a second embodiment.

FIG. 12 is a diagram illustrating a configuration example of an oscillation circuit 21 in an oscillator 1 according to a second embodiment. In FIG. 12, the same reference numerals are given to the same components as those illustrated in FIG. 5. In the example of FIG. 12, k–m (k>m) PMOS transistors 215-$m$+1 to 215-$k$, and k–m PMOS transistors 216-$m$+1 to 216-$k$ are further added to the configuration illustrated in FIG. 5.

Each of the gate terminals of the PMOS transistors 215-$m$+1 to 215-$k$ is electrically connected to the gate terminal of the PMOS transistor 217 in common. Each of the source terminals of the PMOS transistors 215-$m$+1 to 215-$k$ is electrically connected to each of the drain terminals of the PMOS transistors 216-$m$+1 to 216-$k$, respectively. Each of the drain terminals of the PMOS transistors 215-$m$+1 to 215-$k$ is electrically connected to the drain terminal of the NMOS transistor 211 in common.

A voltage having a level (low level or high level) corresponding to each value (0 or 1) of m-th bit to (k−1)-th bit of the k-bit current selection data SELB is respectively applied to each of the gate terminals of the PMOS transistors 216-$m$+1 to 216-$k$. Each of the source terminals of the PMOS transistors 216-$m$+1 to 216-$k$ is electrically connected to an analog power supply in common. Each of the drain terminals of the PMOS transistors 216-$m$+1 to 216-$k$ is electrically connected to each of the source terminals of the PMOS transistors 215-$m$+1 to 215-$k$, respectively.

Since other configurations of the oscillation circuit 21 according to the second embodiment are the same as those according to the first embodiment (FIG. 5), the description thereof will be omitted.

In the oscillation circuit 21 having such a configuration, a current mirror circuit is configured with the PMOS transistors 215-1 to 215-$k$, the PMOS transistors 216-1 to 216-$k$, the PMOS transistor 217, and the constant current source 218. Therefore, assuming that the size ratios between each of the PMOS transistors 215-1 to 215-$k$ and the PMOS transistor 217 are respectively $N_1$ to $N_k$, when each of the PMOS transistors 216-1 to 216-$k$ is in an ON state, currents $I_1$ to $I_k$, which are $N_1$ to $N_k$ times the current $I_0$ flowing through the PMOS transistor 217 (current flowing through the constant current source 218), flow from each of the source terminals of the PMOS transistors 215-1 to 215-$k$ to each of the drain terminals of the PMOS transistors 215-1 to 215-$k$. On the other hand, when each of the PMOS transistors 216-1 to 216-$k$ is in an OFF state, no current flows from each of the source terminals of the PMOS transistors 215-1 to 215-$k$ to each of the drain terminals of the PMOS transistors 215-1 to 215-*k*. Here, when a value of each of the bits SELB[0] to SELB[k−1] of the current selection data SELB is 0, each of the PMOS transistors 216-1 to 216-*k* enters an ON state, and when a value of each of the bits SELB[0] to SELB[k−1] is 1, each of the PMOS transistors 216-1 to 216-*k* enters an OFF state.

The oscillation current $I_{OSC}$, which flows from the drain terminal of the NMOS transistor 211 to the source terminal of the NMOS transistor 211, is the sum of the currents flowing from each of the source terminals of the PMOS transistors 215-1 to 215-*k* to each of the drain terminals of the PMOS transistors 215-1 to 215-*k*, and thus the oscillation current $I_{OSC}$ is represented by the following equation (2).

$$I_{OSC} = \overline{SELB[0]} \cdot I_1 + \overline{SELB[1]} \cdot I_2 + \ldots + \overline{SELB[m-1]} \cdot I_m + \ldots + \overline{SELB[k-1]} \cdot I_k \quad (2)$$

In the second embodiment, the control circuit 23 sets, based on a control signal which is input from the external terminal of the oscillator 1 via the terminal of the oscillation IC 2, an operation mode of the oscillator 1 (oscillation IC 2) to one of a plurality of modes including an external communication mode, a normal operation mode, a CI value inspection mode, and a drive level inspection mode, and performs a control according to the set operation mode. Since the control in the external communication mode and the normal operation mode of the control circuit 23 is the same as that in the first embodiment, the description thereof will be omitted.

In the CI value inspection mode, the control circuit 23 sets the oscillation current $I_{OSC}$ according to values of low-order m bits of the current selection data SELB obtained by converting low-order n bits of the oscillation current setting data IOSC. In the CI value inspection mode, the control circuit 23 sets all values of high-order k-m bits of the current selection data SELB to 1, and thus all of the currents $I_{m+1}$ to $I_k$ become 0. Therefore, it is possible to inspect the CI value of the resonator 3 in the same procedure as that of the first embodiment.

In addition, in the drive level inspection mode, the control circuit 23 sets the oscillation current $I_{OSC}$ of the oscillation circuit 21 according to values of k-bit current selection data SELB obtained by converting p-bit (p>n) oscillation current setting data IOSC stored in an internal register (not illustrated), and performs a control to operate the oscillation circuit 21 and the output circuit 22. That is, in the drive level inspection mode, the control circuit 23 supplies a desired oscillation current $I_{OSC}$, which is larger (or smaller) than the oscillation current $I_{OSC}$ (sum of the currents $I_1$ to $I_m$) in the normal operation mode, to the amplification circuit 24, and thus it is possible to inspect accuracy of the oscillation frequency of the oscillator 1 at a plurality of drive levels.

In the second embodiment, when the power is supplied, in the p-bit oscillation current setting data IOSC, all of the low-order n bits are initialized to 1, and all of the high-order p-n bits are initialized to 0. As a result, in the current selection data SELB, all of the low-order m bits are set to the low level, and all of the high-order k-m bits are set to the high level. Therefore, the same oscillation current $I_{OSC}$ (sum of the currents $I_1$ to $I_m$) as that of the first embodiment is supplied to the amplification circuit 24, and thus the oscillator 1 can reliably start oscillation even in a case where the oscillator 1 transitions to the normal operation mode without passing through the external communication mode.

1-3. Modification Example

In the oscillator 1 according to the first embodiment or the second embodiment, in the CI value inspection mode, each time a pulse is input from the external terminal OE, the value of the oscillation current setting data IOSC (value of the oscillation current $I_{OSC}$) is lowered from the upper limit of a variable range by one level, but, for example, the value of the oscillation current setting data IOSC may be increased from the lower limit of a variable range by one level.

In addition, in the oscillator 1 according to the first embodiment or the second embodiment, in the CI value inspection mode, for example, at each predetermined timing, the control circuit 23 may switch the setting value of the oscillation current $I_{OSC}$ from the upper limit or the lower limit of a variable range by one level, and store the setting value of the oscillation current $I_{OSC}$ when the resonator 3 stops oscillation or when the resonator 3 starts oscillation in an internal register or the like. The control circuit 23 may estimate the negative resistance value of the oscillation circuit 21 by reading the setting value of the oscillation current $I_{OSC}$ when the resonator 3 stops oscillation or when the resonator 3 starts oscillation from the external terminal of the oscillator 1, and inspect the CI value of the resonator 3.

Further, in the oscillator 1 according to the first embodiment or the second embodiment, the value of the oscillation current $I_{OSC}$ (negative resistance of the oscillation circuit 21) is discretely (digitally) changed according to the value of the oscillation current setting data IOSC, but, for example, the value of the oscillation current $I_{OSC}$ may be changed continuously (analogically). For example, the oscillator may be configured such that the value of the oscillation current $I_{OSC}$ (negative resistance of the oscillation circuit 21) is continuously (analogically) changed according to an analog signal input from the external terminal.

Figure 13:
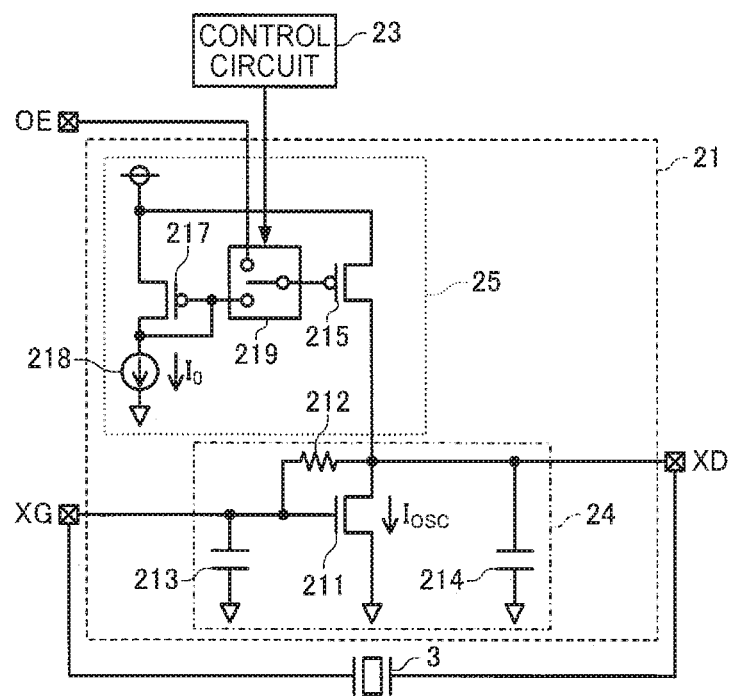
FIG. 13 is a diagram illustrating a configuration example of an oscillation circuit in an oscillator according to a modification example.

FIG. 13 is a diagram illustrating a configuration example of an oscillation circuit 21 in an oscillator 1 according to a modification example. In FIG. 13, the same reference numerals are given to the same components as those illustrated in FIG. 5. In the example of FIG. 13, the configuration of the amplification circuit 24 is the same as the configuration of the amplification circuit 24 illustrated in FIG. 5, and the configuration of the current source 25 is different from the configuration of the current source 25 illustrated in FIG. 5.

In the example of FIG. 13, in the normal operation mode, the control circuit 23 of the oscillator 1 controls a switch circuit 219 such that the gate terminal of the PMOS transistor 215 is electrically connected to the gate terminal of the PMOS transistor 217. Accordingly, a current mirror circuit is configured with the PMOS transistor 215, the switch circuit 219, the PMOS transistor 217, and the constant current source 218. Accordingly, assuming that the size ratio between the PMOS transistor 215 and the PMOS transistor 217 is $N_X$, the oscillation current $T_{OSC}$, which is $N_X$ times the current $T_0$ flowing through the PMOS transistor 217 (current flowing through the constant current source 218), flows. The oscillation current $T_{OSC}$ is set to be sufficiently large, and thus the negative resistance value of the oscillation circuit 21 becomes sufficiently larger than the CI value of the resonator 3. Therefore, the resonator 3 can oscillate at a desired frequency.

On the other hand, in the CI value inspection mode or the drive level inspection mode, the control circuit 23 controls the switch circuit 219 such that the gate terminal of the PMOS transistor 215 is electrically connected to the external terminal OE of the oscillator 1 (OE terminal of the oscillation IC 2). Thus, a voltage can be applied from the external terminal OE of the oscillator 1 to the gate terminal of the PMOS transistor 215. The value of the oscillation current $T_{OSC}$ (negative resistance of the oscillation circuit 21) is changed according to the voltage applied to the gate terminal of the PMOS transistor 215. Therefore, a desired voltage is subsequently applied to the external terminal OE of the oscillator 1, and thus it is possible to inspect the CI value and the drive level.

Further, although the oscillator 1 according to the first embodiment or the second embodiment is a simple oscillator (simple packaged crystal oscillator (SPXO) or the like), which does not perform temperature compensation or temperature control, for example, an oscillator having a temperature compensation function (temperature compensated crystal oscillator (TCXO) or the like), an oscillator having a temperature control function (oven controlled crystal oscillator (OCXO) or the like), or an oscillator having a frequency control function (voltage controlled crystal oscillator (VCXO) or the like) may be used.

2. Electronic Apparatus

Figure 14:
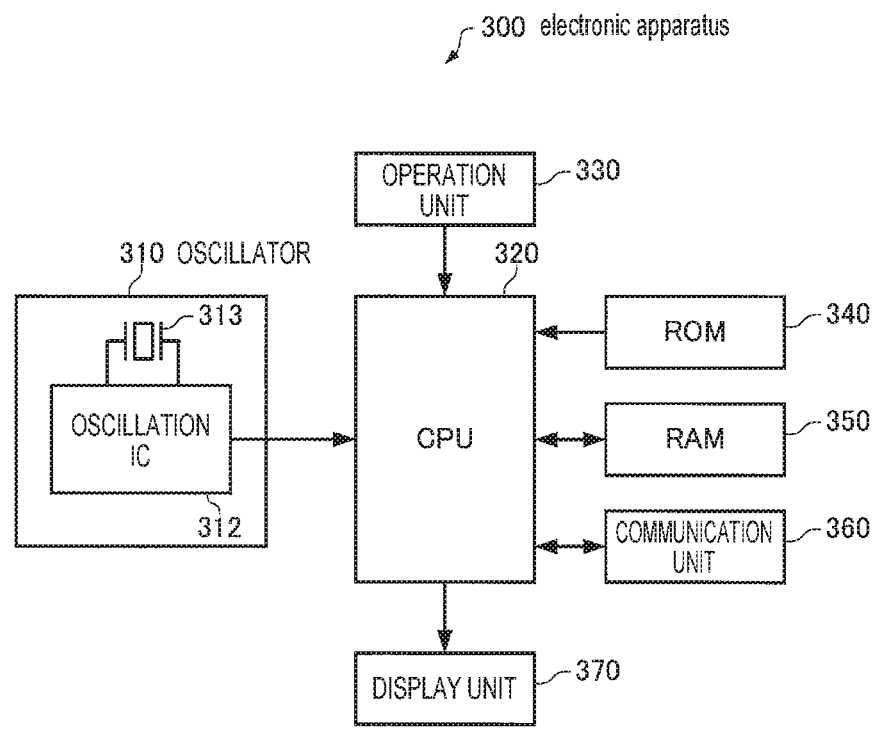
FIG. 14 is a functional block diagram of an electronic apparatus according to the present embodiment.
Figure 15:
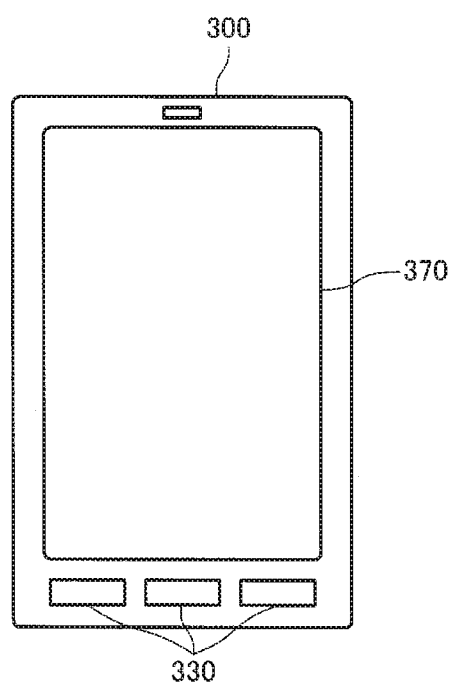
FIG. 15 is a view illustrating an example of an external appearance of the electronic apparatus according to the present embodiment.

FIG. 14 is a functional block diagram illustrating an example of a configuration of an electronic apparatus according to the present embodiment. FIG. 15 is a diagram illustrating an example of an external appearance of a smartphone which is an example of the electronic apparatus according to the present embodiment.

The electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. The electronic apparatus according to the present embodiment may have a configuration in which a part of the components (units) illustrated in FIG. 14 is omitted or changed, or in which another component is added.

The oscillator 310 includes an oscillation IC 312 and a resonator 313. The oscillation IC 312 generates an oscillation signal by oscillating the resonator 313. The oscillation signal is output from the external terminal of the oscillator 310 to the CPU 320.

The CPU 320 is a processing unit that performs various calculation processing and control processing using the oscillation signal, which is input from the oscillator 310 as a clock signal, according to a program stored in the ROM 340 or the like. Specifically, the CPU 320 performs various processing according to an operation signal from the operation unit 330, processing of controlling the communication unit 360 to perform data communication with an external apparatus, processing of transmitting a display signal for displaying various kinds of information on the display unit 370, and the like.

The operation unit 330 is an input device which is configured with operation keys, button switches, and the like, and outputs an operation signal according to an operation by a user to the CPU 320.

The ROM 340 is a storage unit that stores programs, data, and the like required for performing various calculation processing and control processing by the CPU 320.

The RAM 350 is used as a work area of the CPU 320, and is a storage unit that temporarily stores programs and data which are read from the ROM 340, data which is input from the operation unit 330, calculation results which are obtained by execution of various programs by the CPU 320, and the like.

The communication unit 360 performs various controls for establishing data communication between the CPU 320 and the external apparatus.

The display unit 370 is a display device configured with a liquid crystal display (LCD) and the like, and displays various kinds of information based on a display signal input from the CPU 320. The display unit 370 may be provided with a touch panel which functions as the operation unit 330.

The oscillator 1 according to each embodiment described above is applied as the oscillator 310, or the oscillation IC 2 according to each embodiment described above is applied as the oscillation IC 312, and thus it is possible to reduce the size of the oscillator 310 and reduce a risk of breakdown due to static electricity. Further, it is possible to inspect the impedance value of the resonator 313, and thus it is possible to realize the electronic apparatus with high reliability while reducing cost.

As the electronic apparatus 300, various electronic apparatuses are considered, and examples of the electronic apparatuses include a personal computer (for example, a mobile-type personal computer, a laptop personal computer, or a tablet personal computer), a mobile terminal such as a smartphone or a mobile phone, a digital still camera, an ink jet ejecting apparatus (for example, an ink jet printer), a storage area network apparatus such as a router or a switch, a local area network apparatus, an apparatus for abase station of a mobile terminal, a television, a video camera, a video recorder, a car navigation apparatus, a real-time clock apparatus, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, an electronic thermometer, a sphygmomanometer, a blood sugar meter, an electrocardiogram measurement, an ultrasound diagnostic apparatus, and an electronic endoscope), a fish detector, various measurement apparatuses, meters and gauges (for example, meters and gauges of a vehicle, an aircraft, and a vessel), a flight simulator, a head-mounted display, a motion tracer, a motion tracker, a motion controller, PDR (walker position and direction measurement), and the like.

An example of the electronic apparatus 300 according to the present embodiment includes a transmission apparatus, which functions as, for example, an apparatus for abase station of a terminal that performs communication with a terminal in a wired or wireless manner using the oscillator 310 as a reference signal source. For example, the oscillator 1 according to each embodiment described above is applied as the oscillator 310, and thus it is possible to realize the electronic apparatus 300, which can be used in, for example, a communication base station and is desired to have high frequency accuracy, high performance, and high reliability, at a lower cost compared to the case of the related art.

Further, as another example of the electronic apparatus 300 according to the present embodiment, a communication apparatus in which the communication unit 360 receives an external clock signal and the CPU 320 (processing unit) includes a frequency control unit that controls the frequency of the oscillator 310 based on the external clock signal and the output signal of the oscillator 310 (internal clock signal), may be used. The communication apparatus may be, for example, a basic system network apparatus such as a stratum 3, or a communication apparatus used for a femtocell.

3. Vehicle

Figure 16:
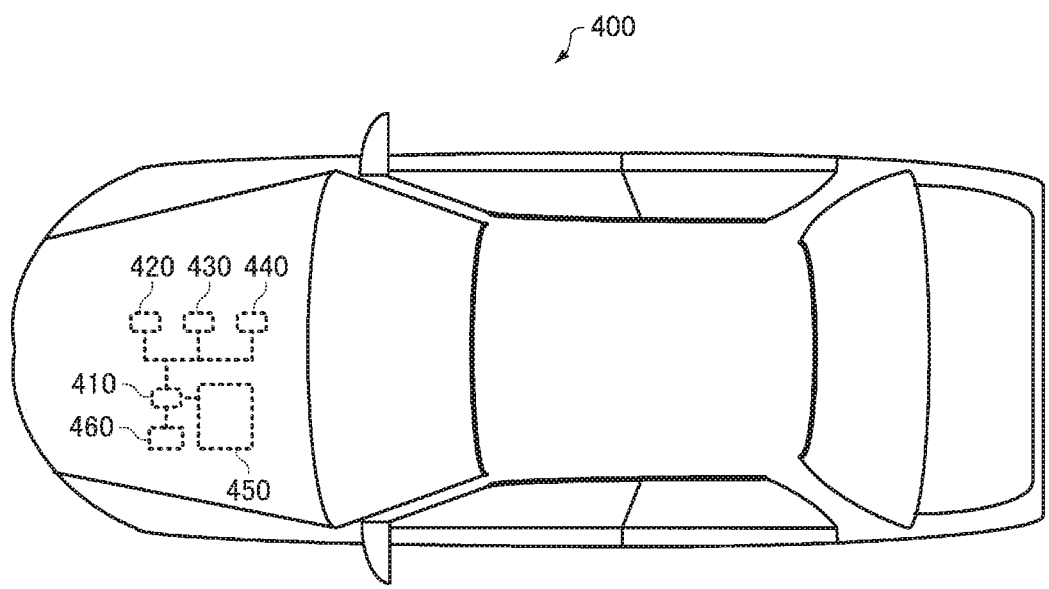
FIG. 16 is a view illustrating an example of a vehicle according to the present embodiment.

FIG. 16 is a view (top view) illustrating an example of a vehicle according to the present embodiment. The vehicle 400 illustrated in FIG. 16 includes controllers 420, 430, and 440 that perform various controls for an oscillator 410, an engine system, a brake system, a keyless entry system, and the like, a battery 450, and a backup battery 460. The vehicle according to the present embodiment may have a configuration in which a part of the components (units) illustrated in FIG. 16 is omitted, or in which another component is added.

The oscillator 410 includes an oscillation IC and a resonator which are not illustrated, and the oscillation IC generates an oscillation signal by oscillating the resonator. The oscillation signal is output from the external terminal of the oscillator 410 to the controllers 420, 430, and 440, and is used as, for example, a clock signal.

The battery 450 supplies the power to the oscillator 410 and the controllers 420, 430, and 440. The backup battery 460 supplies the power to the oscillator 410 and the controllers 420, 430, and 440 when the output voltage of the battery 450 is lower than a threshold.

The oscillator 1 according to each embodiment described above is applied as the oscillator 410, or the oscillation IC 2 according to each embodiment described above is applied as the oscillation IC included in the oscillator 410, and thus it is possible to reduce the size of the oscillator 410 and reduce a risk of breakdown due to static electricity. Further, it is possible to inspect the impedance value of the resonator included in the oscillator 410, and thus it is possible to realize the vehicle with high reliability while reducing cost.

As the vehicle 400, various vehicles are considered, and examples of the vehicles include, for example, an automobile (including an electric car), an aircraft such as a jet plane or a helicopter, a vessel, a rocket, a satellite, and the like.

The invention is not limited to the present embodiment, and various modifications can be made without departing from the scope of the invention.

Each of the above-described embodiments and modification example is an example, and is not limited thereto. For example, the embodiments and modification example can also be appropriately combined.

The invention includes configurations (for example, configurations having the same functions, methods and results, or configurations having the same objects and effects) which are substantially the same as the configurations described in the embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2016-108269, filed May 31, 2016 is expressly incorporated by reference herein.

What is claimed is:

1. An oscillator comprising:
an external terminal;
a resonator;
an oscillation circuit that oscillates the resonator, wherein the oscillation circuit includes an amplification circuit and a current source that supplies a current to the amplification circuit; and
a control circuit that controls an operation of the oscillation circuit,
wherein the oscillator operates in an operation mode selected from a plurality of modes including at least an inspection mode, the control circuit sets the operation mode of the oscillator to one of the plurality of modes based on a control signal input from the external terminal, wherein, when the oscillator is operating in the inspection mode, the current is variably set according to the control signal, wherein the control signal includes at least one pulse, wherein a setting value of the current is changed to a different value from a previous value each time the pulse is respectively input to the external terminal, wherein a negative resistance value of the oscillation circuit is changed according to changes in the current, and wherein, in response to an impedance value of the resonator being larger than the negative resistance value of the oscillation circuit, oscillation of the resonator is stopped.

2. The oscillator according to claim 1,
wherein, in a case where the current is set to a lower limit of a variable range, the resonator does not oscillate, and in a case where the current is set to an upper limit of a variable range, the resonator oscillates.

3. The oscillator according to claim 2,
wherein, as the current becomes large, negative resistance of the oscillation circuit becomes large.

4. The oscillator according to claim 2,
wherein the amplification circuit includes an NMOS transistor and a resistor of which the both ends are electrically connected to each of a gate terminal and a drain terminal of the NMOS transistor, and
wherein the current source supplies the current to the drain terminal of the NMOS transistor.

5. The oscillator according to claim 2,
wherein an external terminal electrically connected to wiring which connects the resonator and the oscillation circuit, is not included.

6. The oscillator according to claim 1,
wherein, as the current becomes large, negative resistance of the oscillation circuit becomes large.

7. The oscillator according to claim 6,
wherein the amplification circuit includes an NMOS transistor and a resistor of which the both ends are electrically connected to each of a gate terminal and a drain terminal of the NMOS transistor, and
wherein the current source supplies the current to the drain terminal of the NMOS transistor.

8. The oscillator according to claim 6,
wherein an external terminal electrically connected to wiring which connects the resonator and the oscillation circuit, is not included.

9. The oscillator according to claim 1,
wherein the amplification circuit includes an NMOS transistor and a resistor of which the both ends are electrically connected to each of a gate terminal and a drain terminal of the NMOS transistor, and
wherein the current source supplies the current to the drain terminal of the NMOS transistor.

10. The oscillator according to claim 9,
wherein an external terminal electrically connected to wiring which connects the resonator and the oscillation circuit, is not included.

11. The oscillator according to claim 1,
wherein an external terminal electrically connected to wiring which connects the resonator and the oscillation circuit, is not included.

12. An electronic apparatus comprising:
the oscillator according to claim 1.

13. A vehicle comprising:
the oscillator according to claim 1.

14. A method of manufacturing an oscillator, comprising:
assembling the oscillator that includes an external terminal, a resonator, and an oscillation circuit which oscillates the resonator, the oscillation circuit includes an amplification circuit and a current source that supplies a current to the amplification circuit, and a control circuit that controls an operation of the oscillation circuit, wherein the oscillator operates in an operation mode selected from a plurality of modes including at least an inspection mode, the control circuit sets the operation mode of the oscillator to one of the plurality modes based on a control signal input from the external terminal, wherein, when the oscillator is operating in the inspection mode, the current being variably set according to the control signal, wherein the control signal includes at least one pulse, wherein a setting value of the current is changed to a different value from a previous value each time the pulse is respectively input to the external terminal, wherein a negative resistance value of the oscillation circuit is changed according to changes in the current, and wherein, in response to an impedance value of the resonator being larger than the negative resistance value of the oscillation circuit, oscillation of the resonator is stopped;

inputting the control signal to the external terminal; and setting the operation mode of the oscillator to the inspection mode; and estimating the impedance value of the resonator by inspecting the oscillator based on a signal output from the oscillator.

* * * * *